United States Patent [19]

Pace

[11] Patent Number: 4,709,159
[45] Date of Patent: Nov. 24, 1987

[54] CAPACITANCE MULTIPLIER CIRCUIT

[75] Inventor: Wilson D. Pace, Tempe, Ariz.

[73] Assignee: Motorola, Inc., Schaumburg, Ill.

[21] Appl. No.: 286,119

[22] Filed: Jul. 23, 1981

Related U.S. Application Data

[63] Continuation of Ser. No. 122,629, Feb. 19, 1980, abandoned.

[51] Int. Cl.$^4$ .............................................. H03K 4/02
[52] U.S. Cl. .................................... 307/227; 307/297;
307/299.2; 528/127; 528/128; 357/36; 357/51;
357/81
[58] Field of Search .................... 307/299, 299 B, 297;
328/127, 128; 357/36, 51, 81

[56] References Cited

U.S. PATENT DOCUMENTS 3,633,052 1/1972 Hanna ............................. 307/299 B
3,911,296 10/1975 Davis .................................. 307/297
4,081,822 3/1978 Oao et al. .............................. 357/36

Primary Examiner—Joseph E. Clawson, Jr.
Attorney, Agent, or Firm—Michael D. Bingham

[57] ABSTRACT

A capacitance multiplier circuit is disclosed which is fabricated using integrated circuit techniques comprising an inverted multiple collector transistor structure wherein a first one of the multiple collectors is electrically shorted to the base of the transistor to form a current mirror. The collector areas between the first collector and a second one of the multiple collectors are area ratioed to provide a multiplication factor, which is determined by the ratio between the areas of the two collector regions. The capacitance value formed between the junction of the base and the second collector regions is multiplied by this multiplication factor to produce an effective capacitance at the second collector. The multiplication factor is independent to process and temperature variations.

3 Claims, 4 Drawing Figures

CAPACITANCE MULTIPLIER CIRCUIT

This is a continuation of application Ser. No. 122,629, filed Feb. 19, 1980 now abandoned.

FIELD OF THE INVENTION

The present invention relates to monolithic integrated capacitance multiplier circuits and more particularly to a merged transistor-capacitor structure for producing an area multiplied effective capacitance.

BACKGROUND OF THE PRIOR ART

Capacitance multiplier circuits are known in the art. For example, U.S. Pat. No. 3,911,296, William F. Davis, which is assigned to Motorola, Inc. discloses such a circuit. This prior art capacitance multiplier circuit comprises an integrated capacitor structure coupled between the collector and base electrodes of an integrated NPN transistor. As brought out in this prior art patent, the effective capacitance is a function of the amplification factor, beta, of the device.

Although the prior art circuit is quite useful for multiplying either an "on-chip" capacitance or discrete capacitance value by the amplification factor of the transistor to produce a large effective capacitance at the collector of the NPN transistor, the prior art circuit suffers from several disadvantages. The most significant disadvantage of the prior art circuit is that the resultant effective capacitance of the beta multiplied capacitor is a function of the beta of the transistor and is therefore process and temperature dependent. Thus, due to process and temperature variations the value of the effective capacitance will vary between a minimum and maximum limit which may not be acceptable in a system utilizing such a capacitance multiplier circuit.

Although the prior art capacitance circuit utilizes small "on-chip" value capacitor, another disadvantage is that this capacitor takes up die area of the integrated circuit chip. In some applications, i.e., large scaled integrated circuits, the useable area of the integrated circuit chip becomes quite important such that elimination of the need to assign a portion of the area to fabricate "on-chip" capacitors can be a significant advantage to the circuit designer.

Thus, a need exists for providing a capacitance multiplier circuit for deriving large effective capacitance values which are neither process or temperature dependent while simultaneously reducing the "on-chip" area required to produce the effective capacitances.

SUMMARY OF THE INVENTION

Accordingly, it is an object of the present invention to provide an improved capacitance multiplier circuit.

Another object of the present invention is to provide an monolithic integrated capacitance multiplier circuit structure requiring minimum "on-ship" area to be utilized by the structure.

Still another object of the present invention is to provide an integrated circuit capacitance multiplier circuit structure wherein the effective capacitance produced thereby is substantially independent to process and temperature variations.

A further object of the present invention is to provide an integrated transistor-capacitor structure for producing an effective capacitance having a predetermined value that is proportional to a constant multiple of the junction capacitance formed between the collector and base electrode regions of the transistor.

In accordance with the foregoing and other objects there is provided an integrated circuit structure comprising an inverted multiple collector transistor having a first one of the multiple collectors return to the base thereof. The area of this first collector is ratioed with respect to the area of a second one of the multiple collectors. The capacitance produced between the junction of the second collector and the base of the transistor is multiplied by the constant ratio factor between the two collector areas to produce an effective capacitance at the second collector of the transistor which is independent to process and temperature variations.

DESCRIPTION OF THE INVENTION

As disclosed by the aforementioned prior art patent comprising an NPN transistor having an integratead capacitor coupled between the collector and base electrodes thereof, an effective capacitance is produced between the collector and ground having a value of $(\beta+1)$ C; where beta, $\beta$, is the amplification factor of the transistor and C is the integrated circuit capacitor value. The most significant disadvantage of this circuit, as discussed, is that beta varies with process and temperature variations.

Figure 1:
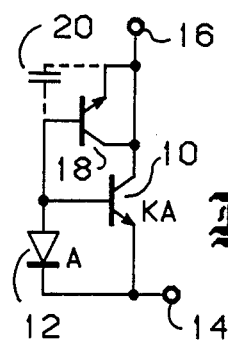
FIG. 1 is a schematic diagram of a capacitance multiplier circuit of a first embodiment of the present invention.

Turning to FIG. 1 there is shown a capacitance multiplier circuit suitable for fabrication in integrated circuit form for producing an effective capacitance which is substantially independent with process and temperature variations. The capacitance multiplier circuit of FIG. 1 comprises a common current mirror circuit including transistor 10 and diode 12 wherein the anode of diode 12 is coupled to the base of transistor 10 and the cathode is coupled with the emitter of the transistor to node 14 of the integrated circuit structure embodying the current mirror. The collector of transistor 10 is shown connected to another node 16 which would be internal to the integrated circuit structure. A second transistor 18 is shown as having its collector and emitter connected in common to the collector of transistor 10 and its base connected to the base of this same transistor. Capacitor 20 is shown in dashed form to indicate that this capacitor is the parasitic emitter-to-base junction capacitance of transistor 18; transistor 18 being an integrated transistor structure. In the preferred embodiment of FIG. 1, diode 12 would typically be formed utilizing a transistor having its collector electrically shorted to its base as is understood. As shown, the area of the emitter of transistor 10 is K times the area of the PN junction forming diode 12 (the emitter of the transistor forming diode 12).

It can easily be shown that the structure of FIG. 1 produces an effective capacitance at the collector of transistor 10 which is equal to $(K+1)$ times the value of the junction capacitance 20 where beta is substantially greater tha the factor K. Hence, the circuit of FIG. 1 will perform the same function of the beta multiplied capacitance of the prior art circuit wherein beta is forced to equal K (the area ratio of the emitters forming transistor 10 and diode 12). The effective capacitance derived at the collector of transistor 10 is then a function purely of the geometries of the devices 10 and 12 and is therefore substantially independent to variations in process and temperature.

Figure 2:
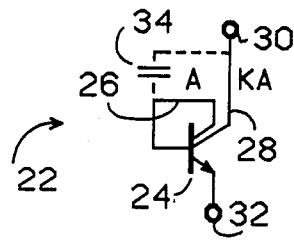
FIG. 2 is a schematic diagram of the preferred embodiment of the present invention.

Turning to FIG. 2 there is shown a merged transistor-capacitance structure 22 of the preferred embodiment which provides an area multiplied effective capacitance as discussed above with regards to the structure of FIG. 1. The current mirror circuit comprising transistor 10 and diode 12 (FIG. 1) has been replaced by the multiple collector transistor 24 shown as having a first one of the multiple collectors 26 electrically shorted to the base thereof. A second one of the multiple collectors 28 is shown coupled to node 30 of an integrated circuit in which transistor 24 is fabricated. The emitter of transistor 24 would be coupled to a second node 32 of the integrated circuit. As will be further discussed hereinafter the capacitor 34 shown in dashed form is the capacitance produced between the junction of collector region 28 and the base region of transistor 24.

Figure 3:
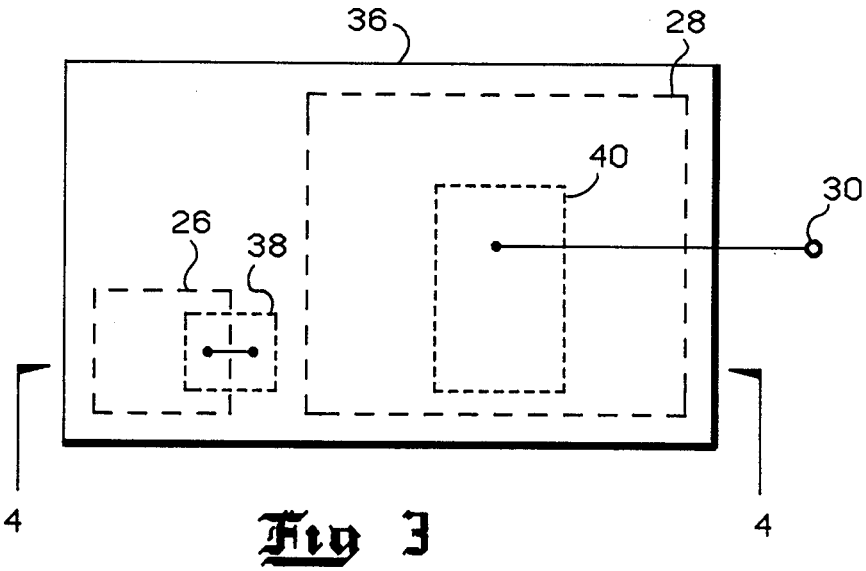
FIG. 3 is a plan view of a portion of an integrated circuit showing the preferred embodiment of the present invention.
Figure 4:
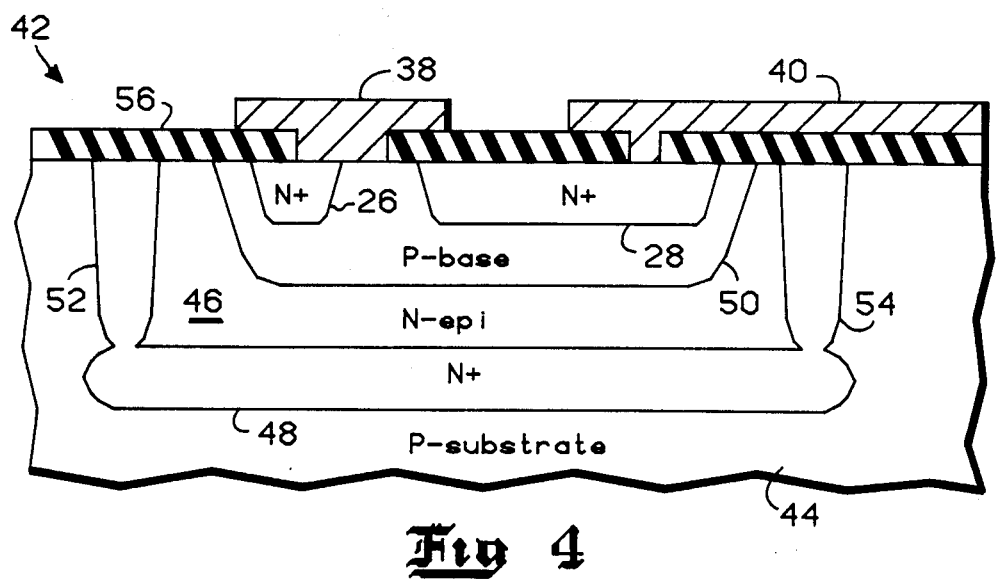
FIG. 4 is a cross-sectional view taken in the directions of the arrows 4—4 of FIG. 3 showing the preferred embodiment of the invention.

Turning to FIGS. 3 and 4, transistor 24 in the preferred embodiment, is realized by an inverted NPN multiple collector transistor structure. This structure is compatible with present day integrated injection logic ($I^2L$) fabrication techniques. As shown in FIGS. 3 and 4, N+ collectors regions 26 and 28 are formed in P-base region 36. Collector 26 is shorted to the base 36 by metalization conductor 38. Collector 28 is connected to node 30 through a metallization layer schematically shown by reference numeral 40. The cross-sectional view of the integrated circuit structure of the present invention is shown in FIG. 4. Here the integrated circuit, designated by the reference numeral 42, which embodies the merged transistor-capacitance multiplier circuit 22 is fabricated utilizing a P-type substrate; semiconductor material of a first conductivity type. Multiple collector inverted transistor 24 is fabricated of N-type epitaxial semiconductor material layer 46 being formed on P-substrate 44. As is understood, buried layer 48 of highly doped N-type semiconductor material is formed between epitaxial region 46 and the substrate 44. Epitaxial layer region 46 serves as the emitter of transistor 24 of FIG. 2. A P-type base region 50 which corresponds to base region 36 (FIG. 3) is diffused into epitaxial region 46 to form the single base region for transistor 24. Next, N+-type multiple collector regions 26 and 28 are diffused into the P-base region utilizing standard integrated circuit fabrication techniques. Collectors 26 and 28 are formed of highly doped N-type semiconductor material. As shown, epitaxial region 46, P-base region 50, and multiple collector regions 26 and 28 have coplanar outwardly facing surfaces. A lightly doped N+ collar region comprising diffused areas 52 and 54. Contacting buried layer 48 surrounds the emitter region 46 of transistor 24.

Using known photolithographic techniques, silicon dioxide layer 56 is grown on the surfaces of the aforementioned regions with appropriate openings formed therein. A selectively patterned layer of metallization is applied such that, as shown in FIG. 4, the collector region 26 is shorted to the base region 50 of transistor 22 by metal layer 38; and collector region 28 is connected by metal layer 40 to an appropriate node of the integrated circuit. It should be appreciated that a metallization layer may be provided through an appropriate opening in layer 56 to the epitaxial region to couple this emitter region to a particular node within the integrated circuit.

The aforedescribed structure produces a parasitic capacitance between the junction of collector region 28 with the P-base region 50 to form the capacitance 34. Similarly, with regard to FIG. 1, in the configuration of FIG. 2 (wherein the collector region 28 has an area K times that of the area of collector region 26) the capacitance 34 is multiplied by this ratio factor (K) to produce an effective capacitance seen at node 30 which is equal to the value of (K+1) C where C is the value of the capacitance 34.

The circuit structure of FIGS. 2-4 provide an advantage over the embodiment of FIG. 1 in that the multiple collectors are formed in one single P-base region whereby minimum die area is used on the surface of the integrated circuit chip. Additionally, the structure of FIGS. 2-4 eliminates the need for transistor 18 (FIG. 1) while providing the same effective capacitance multiplier factor.

The capacitance multiplier circuit herein described can be used in many applications. For example, the preferred embodiment may be utilized in a delay circuit wherein the effective capacitance value determines the delay period, or the preferred embodiment may be utilized to provide a large filtering capacitor.

In summary, the invention described herein provides a integrated capacitance multiplier circuit having a merged transistor-capacitor structure which provides an effective capacitance equal to the ratio between the areas of two of the multiple collectors of an inverted NPN transistor structure. The effective capacitance has a value that is therefore substantially independent to process and temperature variations and requires minimum chip area for fabrication within an integrated circuit.

I claim:
1. A merged integrated vertical NPN transistor-capacitor structure, comprising:
   an integrated circuit substrate, said substrate being formed of a semiconductor material of a first conductivity type;
   an epitaxial region formed on said substrate having a substantially planar outwardly facing surface, said epitaxial region being formed of a semiconductor material of a second conductivity type and being the emitter of the transistor;
   a first region formed within said epitaxial region having an outwardly facing surface substantially coplanar with said surface of said epitaxial region, said first region being formed of semiconductor material of said first conductivity type and being the base of the transistor;
   a plurality of regions of said semiconductor material of said second conductivity type formed in said first region in spaced relationship to one another, said plurality of regions having outwardly facing surfaces substantially coplanar with said first and said epitaxial regions and forming multi-collectors of the transistor;
   a layer of dielectric material formed respectively on said outwardly facing surfaces of said epitaxial regions, said first region and said plurality of regions, said dielectric layer having openings formed selectively therein;

conductivity means selectively formed over said dielectric layer for electrically shorting said first region to a first one of said plurality of regions; and a second one of said plurality of regions having a surface area equal to a constant K times the area of a first one of said plurality of regions wherein K is greater than 1 which produces an effective capacitance which has a value proportional to (1+K) times the value of the capacitance formed between the junction of said second one of said plurality of regions with said first regions.

2. The integrated transistor-capacitor structure of claim 1 wherein:

said semiconductor material of a first conductivity type being P-type material; and said semiconductor material of a second conductivity type being N-type material.

3. A monolithic integrated merged transistor-capacitor circuit, comprising a vertical NPN transistor having an emitter region, a base region formed in said emitter region and at least two collector regions each formed within said base region providing a PN junction therewith, said emitter region being coupled to a first circuit node within the integrated circuit, said base region being electrically shorted to a first one of said two collector regions, the second one of said two collector regions having an area equal to a constant K times the area of said first collector region wherein K is greater than 1 for producing an effective capacitance at the second collector region having a value proportional to (1+K) times the capacitance formed between said PN junction of said base region and said second collector region, said effective capacitance being substantially independent to temperature and process variations.

* * * * *